(12) United States Patent
Okamoto et al.

(10) Patent No.: US 9,814,124 B2
(45) Date of Patent: Nov. 7, 2017

(54) SURGE PROTECTION DEVICE, METHOD FOR MANUFACTURING THE SAME, AND ELECTRONIC COMPONENT INCLUDING THE SAME

(71) Applicant: Murata Manufacturing Co., Ltd., Kyoto (JP)

(72) Inventors: Masanori Okamoto, Kyoto (JP); Yukio Maeda, Kyoto (JP); Shuji Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 161 days.

(21) Appl. No.: 14/972,580

(22) Filed: Dec. 17, 2015

(65) Prior Publication Data

US 2016/0105948 A1 Apr. 14, 2016

Related U.S. Application Data

(63) Continuation of application No. PCT/JP2014/066847, filed on Jun. 25, 2014.

(30) Foreign Application Priority Data

Jul. 3, 2013 (JP) .................................. 2013-139765

(51) Int. Cl.
*H05F 3/00* (2006.01)
*H05F 3/02* (2006.01)
(Continued)

(52) U.S. Cl.
CPC ................. *H05F 3/04* (2013.01); *B22F 3/10* (2013.01); *B22F 5/00* (2013.01); *C22C 29/12* (2013.01);
(Continued)

(58) Field of Classification Search
CPC ................. H05F 3/04; B22F 3/10; B22F 5/00
(Continued)

(56) References Cited

U.S. PATENT DOCUMENTS

2009/0067113 A1 3/2009 Urakawa
2011/0222197 A1* 9/2011 Adachi ..................... H01T 4/12
361/56
(Continued)

FOREIGN PATENT DOCUMENTS

JP  2010-129320 A   6/2010
WO  2008/146514 A1  12/2008
(Continued)

OTHER PUBLICATIONS

International Search Report issued in Application No. PCT/JP2014/066847 dated Sep. 16, 2014.
(Continued)

*Primary Examiner* — Thienvu Tran
*Assistant Examiner* — Lucy Thomas
(74) *Attorney, Agent, or Firm* — Pearne & Gordon LLP

(57) ABSTRACT

The present disclosure provides a surge protection device including a ceramic substrate (1), at least one pair of discharge electrodes (31) disposed on a surface of the ceramic substrate (1) so as to face each other at end portions thereof with a space in between, outer electrodes (32) electrically connected to the corresponding discharge electrodes (31), and a discharge auxiliary electrode (4) disposed between the end portions of the pair of discharge electrodes (31) The discharge auxiliary electrode (4) contains crystalized glass and particles of conductive powder (40) dispersed apart from each other in the crystalized glass.

9 Claims, 2 Drawing Sheets

(51) Int. Cl.
*H01H 47/00* (2006.01)
*H05F 3/04* (2006.01)
*H01T 1/20* (2006.01)
*H01T 4/12* (2006.01)
*H01T 21/00* (2006.01)
*B22F 3/10* (2006.01)
*B22F 5/00* (2006.01)
*C22C 29/12* (2006.01)
*C22C 32/00* (2006.01)
*H01T 2/02* (2006.01)
*H05K 1/02* (2006.01)

(52) U.S. Cl.
CPC .............. *C22C 32/001* (2013.01); *H01T 1/20* (2013.01); *H01T 4/12* (2013.01); *H01T 21/00* (2013.01); *H01T 2/02* (2013.01); *H05K 1/026* (2013.01)

(58) Field of Classification Search
USPC .......................................... 361/56, 111, 220
See application file for complete search history.

(56) References Cited

U.S. PATENT DOCUMENTS

| | | |
|---|---|---|
| 2012/0169452 A1 | 7/2012 | Hiehata |
| 2014/0126102 A1 | 5/2014 | Sumi et al. |
| 2014/0192447 A1 | 7/2014 | Sumi |
| 2015/0140201 A1 | 5/2015 | Adachi |

FOREIGN PATENT DOCUMENTS

| | | |
|---|---|---|
| WO | 2010/061550 A1 | 6/2010 |
| WO | 2011/040437 A1 | 4/2011 |
| WO | 2013-011821 A1 | 1/2013 |
| WO | 2013/038893 A1 | 3/2013 |

OTHER PUBLICATIONS

Translation of Written Opinion issued in Application No. PCT/JP2014/066847 dated Sep. 16, 2014.

\* cited by examiner

FIG.1
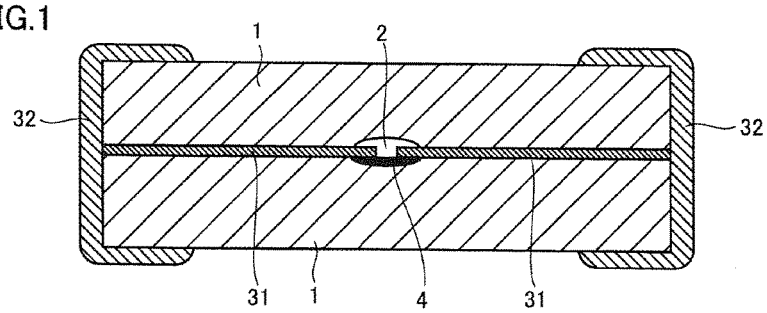
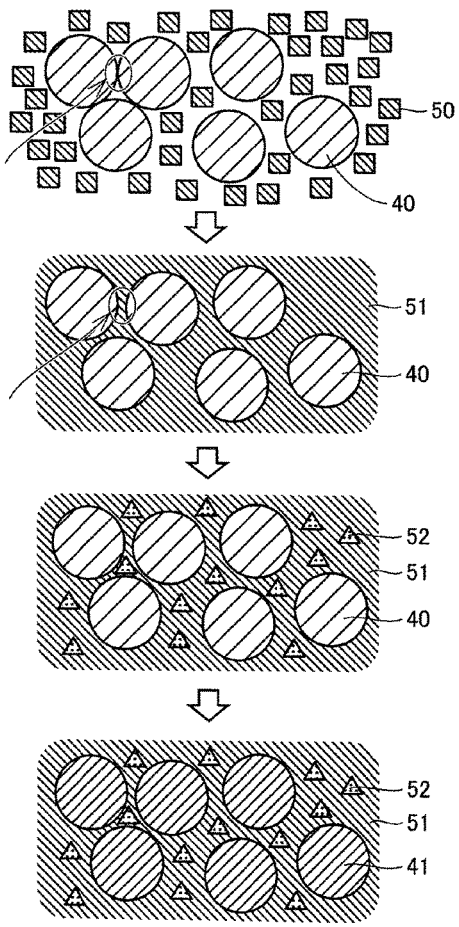
(a) BEFORE SINTERING
PHYSICAL CONTACT
(b) GLASS SOFTENING
SOFTENED GLASS FLOWS IN
BETWEEN POWDER PARTICLES
(c) GLASS CRYSTALLIZATION
(d) SINTERING CONDUCTIVE
POWDER
FIG. 2

SURGE PROTECTION DEVICE, METHOD FOR MANUFACTURING THE SAME, AND ELECTRONIC COMPONENT INCLUDING THE SAME

BACKGROUND OF THE DISCLOSURE

Field of the Disclosure

The present disclosure relates to a surge protection device, a method for manufacturing the same, and an electronic component including the same.

Description of the Related Art

Electro-Static Discharge (ESD) is a phenomenon of severe discharge when a charged conductive body (for example, a human body) comes into contact with or comes into close proximity to another conductive body (for example, an electronic device). ESD causes damage to or malfunction of an electronic device. Circuits of the electronic device should be protected from application of excessively high voltages resulting from the discharge so as to prevent the damage or malfunction. A surge protection device, which is also known as a surge absorbing element or a surge absorber, is used for the above-described purpose.

A surge protection device is disposed, for example, between a signal line and a ground (earth) of a circuit. Since the surge protection device has a configuration including a pair of discharge electrodes separated and opposed to each other, the surge protection device has high electrical resistance and a signal does not flow to the ground during the typical operation. However, when an excessively high voltage, for example, a voltage of static electricity from an antenna of a mobile phone or the like is applied, a discharge occurs between the discharge electrodes of the surge protection device to lead the static electricity to the ground. Accordingly, the voltage of the static electricity is not applied to the circuits downstream of the surge protection device and thus the circuits can be protected.

For example, a surge protection device illustrated in FIG. 1 has a cavity 2 formed inside of a multilayer body of a ceramic substrate 1, and includes a discharge auxiliary electrode 4 on an inner surface of the cavity 2, a pair of discharge electrodes 31 in contact with the discharge auxiliary electrode 4, and outer electrodes 32 formed on a surface of the ceramic substrate 1 and connected to the discharge electrodes 31.

The surge protection device as described above is disclosed in, for example, Patent Document 1 (International Publication No. 2008/146514) and Patent Document 2 (Japanese Unexamined Patent Application Publication No. 2010-129320). When a breakdown voltage that causes dielectric breakdown between discharge electrodes 4 is applied, a discharge occurs between the discharge electrodes 4 inside a cavity 2 and an excessively high voltage is directed to the ground. As a result, the surge protection device can protect circuits downstream of the device.

Patent Document 1: International Publication No. 2008/146514

Patent Document 2: Japanese Unexamined Patent Application Publication No. 2010-129320

BRIEF SUMMARY OF THE DISCLOSURE

Discharge auxiliary electrodes of the related art have conductive powder not sufficiently fixed to a ceramic substrate and the conductive powder is scattered or melted by the impact of ESD in some cases, which results in unstable surge protection characteristics (discharge characteristics).

The conductive powder may be fixed more sufficiently to a ceramic substrate by applying a paste including the conductive powder to a predetermined portion of the ceramic substrate containing a glass and then heating it to a glass softening point and crystallization temperature or higher, because the glass serves as a binder. However, when a glass having a crystallization temperature equal to or higher than a sintering temperature of the conductive powder is used, a conductive component may diffuse into the glass or necking (partial bonding between the conductive powder particles) resulted from sintering of the conductive powder may be facilitated, which deteriorates the reliability of the surge protection device.

In view of the problems described above, an object of the present disclosure is to provide a reliable surge protection device capable of stably protecting electronic components or the like from a surge such as ESD.

The present disclosure provides a surge protection device including one or more ceramic substrates, at least one pair of discharge electrodes disposed on one or more surfaces of the ceramic substrates so as to face each other at end portions of the pair of discharge electrodes with a space in between, outer electrodes electrically connected to the respective discharge electrodes, and a discharge auxiliary electrode disposed between the end portions of the pair of discharge electrodes, in which the discharge auxiliary electrode comprises crystalized glass and conductive powder particles dispersed apart from each other in the crystalized glass.

Preferably, the discharge auxiliary electrode includes 0.1 to 90% by volume of the crystalized glass.

The crystalized glass preferably includes at least one element selected from the group consisting of Li, Ba, Sr, Ca, and Ti.

In the above-described surge protection device, the ceramic substrates are laminated, a cavity is formed in a portion between each adjacent ones of the ceramic substrates, and the end portions of the discharge electrodes are exposed to the cavity.

The present disclosure further relates to a method for manufacturing the surge protection device described above, the method including the step of forming the discharge auxiliary electrode by firing a mixture containing conductive powder and a glass raw material at a temperature lower than the sintering start temperature of the conductive powder, the glass raw material having a component softened and crystallized to become the crystalized glass at a temperature lower than the sintering start temperature of the conductive powder.

When the sintering temperature of the ceramic substrate is higher than the sintering start temperature of the conductive powder, it is preferable that the mixture be fired at a temperature lower than the sintering start temperature of the conductive powder and subsequently the mixture be further fired at a temperature equal to or higher than the sintering start temperature of the conductive powder.

The content of the glass raw material preferably ranges from 0.1 to 90% by volume based on the total volume of the conductive powder and the glass raw material.

The glass raw material preferably includes at least one element selected from the group consisting of Li, Ba, Sr, Ca, and Ti.

The present disclosure further relates to an electronic component including the above-described surge protection device.

The present disclosure may provide a reliable surge protection device capable of stably protecting electronic components or the like from a surge such as ESD.

BRIEF DESCRIPTION OF THE SEVERAL VIEWS OF THE DRAWINGS

FIG. 1 is a schematic cross-sectional view illustrating a unit configuration of a surge protection device.

FIG. 2 is a schematic cross-sectional view illustrating a process of forming a discharge auxiliary electrode of a surge protection device.

DETAILED DESCRIPTION OF THE DISCLOSURE

Surge Protection Device

Figure 3:
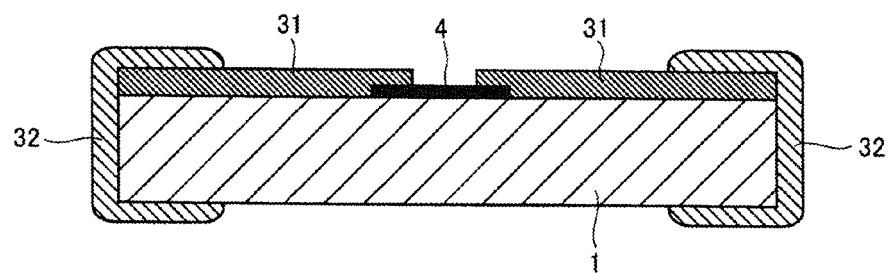
FIG. 3 is a schematic cross-sectional view illustrating a unit configuration of a surge protection device according to a second embodiment.

A surge protection device of the present disclosure includes one or more ceramic substrates, at least one pair of discharge electrodes disposed on one or more surfaces of the ceramic substrates so as to face each other at end portions of the pair of discharge electrodes with a space in between, outer electrodes electrically connected to the respective discharge electrodes, and a discharge auxiliary electrode disposed between the end portions of the pair of the discharge electrodes.

The term "a ceramic substrate" refers to a member including a ceramic material used for an electronic component or the like, which includes, for example, a plate-like member (substrate) made of a ceramic material. The ceramic material includes, but is not limited to, a ceramic material containing Fe, Zn, and Cu as main components, a ceramic material (BAS) containing Ba, Al, and Si as main components, a mixture of forsterite and glass, a mixture of $CaZrO_3$ and glass, and $BaTiO_3$. Low temperature co-fired ceramics (LTCC), which can be fired at a relatively low temperature such as 1050° C. or lower, are preferably used so as to be co-fired with a discharge electrode, an outer electrode, or the like. LTCC include, for example, BAS, ferrite, and glass ceramics containing a mixture of aluminum oxide and borosilicate-based glass.

The term "a discharge electrode" refers to an electrode for discharging between a pair of discharge electrodes when a surge such as ESD occurs. The discharge electrodes are mutually electrically isolated other than when a surge occurs.

The term "an outer electrode" refers to an electrode for electrically connecting a discharge electrode to the outside. Accordingly, each outer electrode is generally electrically connected to each of the discharge electrodes, and is formed so that at least a portion thereof is exposed to a surface of a single or multi-layer substrate including a ceramic substrate.

A material of a discharge electrode and an outer electrode includes, but is not limited to, for example, Ag, Cu, Pd, Pt, Al, Ni, W, Au, Sn, or a combination thereof. The material is preferably Ag, Cu, Ni, or Sn.

The term "a discharge auxiliary electrode" refers to a member inducing a discharge between a pair of facing discharge electrodes. The discharge auxiliary electrode includes crystalized glass and conductive powder particles dispersed apart from each other in the crystalized glass. The discharge auxiliary electrode is a constituent obtained by, for example, firing a constituent-raw material (a mixture containing conductive powder and a glass raw material) of a discharge auxiliary electrode described below.

The term "conductive powder" refers to a particulate material including a conductive material. A conductive material includes Ag, Cu, Pd, Pt, Al, Ni, W, Sn, or a combination thereof, preferably Ag, Cu, or Al. A coated particulate material including a core containing a conductive material and a coating layer covering at least a portion of its surface is preferably used for improving the electrical isolation between the discharge electrodes other than when a surge occurs. The coating layer contains an oxide of the same kind as or a different kind from the conductive material of the core, a ceramic component, and so on.

The term "crystalized glass" refers to a glass including crystal grains in a portion thereof. The crystalized glass is generally obtained by heating (firing) a glass to soften, and then crystalizing the glass in a portion of the softened glass as described below.

The content of the crystalized glass included in a discharge auxiliary electrode of a surge protection device (a final product) ranges preferably from 0.1 to 90% by volume and more preferably from 5 to 80% by volume. The content of the crystalized glass ranging from 0.1 to 90% by volume enables a surge protection function to be obtained, and that ranging from 5 to 80% by volume enables a further desirable surge protection function to be obtained. An insufficient volume of the glass may not provide a fixing effect on the conductive powder in the discharge auxiliary electrode. An excess volume of the glass may not provide a good surge protection function because it reduces the density of the conductive powder.

A composition of the crystalized glass includes, but is not limited to, a group of Si, Li, Ba, Sr, Ca, Ti, and Al. The composition preferably includes at least one element selected from the group consisting of Li, Ba, Sr, Ca, and Ti.

<Method for Manufacturing Surge Protection Device>

A method for manufacturing the surge protection device described above basically includes the step of forming a discharge auxiliary electrode by providing a mixture containing conductive powder and a glass raw material (a constituent-raw material of a discharge auxiliary electrode), and firing the mixture at a temperature lower than the sintering start temperature of the conductive powder.

When a sintering temperature of a ceramic substrate is higher than the sintering start temperature of the conductive powder, the mixture containing the conductive powder and the glass raw material is preferably fired at a temperature lower than the sintering start temperature of the conductive powder, then further fired at a temperature equal to or higher than the sintering start temperature of the conductive powder. Sintering of the ceramic substrate contributes to increasing mechanical strength.

The "glass raw material" includes a component softened and crystallized to form the crystalized glass at a temperature lower than the sintering start temperature of the conductive powder. A softening point (for example, a softening point measured by differential thermal analysis) of a glass raw material and a crystallization start temperature (for example, a crystallization start temperature measured by differential thermal analysis) are preferably lower than the sintering start temperature (for example, the sintering start temperature measured by thermomechanical analysis) of the conductive powder used for a material of a discharge auxiliary electrode and more preferably lower than the sintering start temperature by 50° C. or more.

A glass raw material includes, for example, a glass softened and crystallized at a temperature lower than the sintering start temperature of the conductive powder. The glass preferably includes at least one element selected from the group consisting of Li, Ba, Sr, Ca, and Ti. The glass includes, for example, a glass containing Si, Li, Ba, Sr, Ca, Ti, and Al as main components. Furthermore, a glass containing, an element such as Pb or Bi, B, Zn, Sn, various types of alkaline metals, various types of alkaline earth metals, various types of transition metals, or a mixture of the glass may be used. A glass for the glass raw material is used, for example, in the form of glass powder such as glass frit.

Besides glass powder and so on, a glass raw material further includes a component that is glass transitioned during firing, and softened and crystallized at a temperature lower than the sintering start temperature of conductive powder to provide a glass. A component of the glass raw material includes, for example, an oxide of each element contained in the above-described glass (for example, silica, which is an oxide of Si). To a portion where a discharge auxiliary electrode is formed, mixed powder of respective components may be added, or powder of each component may be added individually.

The same conductive powder as described above may be used as the conductive powder. The content of the glass raw material ranges preferably from 0.1 to 90% by volume and more preferably 5 to 80% by volume based on the total volume of the conductive powder and the glass raw material. The content of the glass raw material ranging from 0.1 to 90% by volume enables a surge protection function to be obtained, and that ranging from 5 to 80% by volume enables a further desirable surge protection function to be obtained. An insufficient volume of the glass may not provide a fixing effect on conductive powder in the discharge auxiliary electrode. An excess volume of the glass may not provide a good surge protection function because it reduces the density of the conductive powder.

A process of forming a discharge auxiliary electrode of a surge protection device according to the present disclosure will hereinafter be described with reference to FIG. 2.

FIG. 2, step(a), illustrates the state of a mixture containing conductive powder 40 and glass frit 50 before firing. Particles of the conductive powder 40 may sometimes be in contact with each other before firing as illustrated in FIG. 2, step(a).

When the temperature of a mixture in the state as illustrated in FIG. 2, step(a), is raised to a softening point (for example, a softening point measured by differential thermal analysis) of a glass (a temperature lower than the sintering start temperature of conductive powder 40) by heating in firing, a glass frit 50 is softened to flow in between particles of the conductive powder 40. Particles of the conductive powder 40 are thus dispersed apart from each other in glass 51 (FIG. 2 step(b)).

When the temperature is further raised to a crystallization start temperature (for example, a crystallization start temperature measured by differential thermal analysis) of glass 51 (a temperature lower than the sintering start temperature of conductive powder 40), which results in crystallization of the glass to precipitate crystal 52 in the glass, the glass (crystallized glass) loses fluidity to solidify as illustrated in FIG. 2 step(c). The temperature is preferably temporarily retained at a temperature at which the nucleation rate of the crystal is maximum, and then preferably elevated to a temperature at which the crystal growth rate is maximum.

Heating is then continued for firing at a temperature of the sintering start temperature (for example, the sintering start temperature measured by thermomechanical analysis) of conductive powder 40 or higher, which results in sintering of the conductive powder 40 to provide sintered conductive powder 41 as illustrated in FIG. 2 step(d). The exterior surfaces of the particles of the conductive powder 40 and 41 are thus coated with the solidified crystallized glass and therefore diffusing and necking of the conductive powder does not occur. A discharge auxiliary electrode including crystallized glass and particles of conductive powder dispersed apart from each other in the crystalized glass is thus formed.

A ceramic is generally sintered at the end of the firing step, and thus a final product of a surge protection device can be obtained.

Firing may be conducted in an air atmosphere in the same way as firing a general ceramic multilayer substrate. The firing may be conducted in a nitrogen atmosphere when a ceramic material having resistance to reduction or having a readily oxidizable electrode material is used. A sheath used for firing may be a sealed sheath or an open sheath.

Embodiments of a unit configuration of a surge protection device according to the present disclosure will hereinafter be described with reference to the drawings. The same symbols denote the same portions or corresponding portions in the drawings of the present disclosure. Dimensions such as length, width, thickness, and depth are occasionally changed for clarity and simplicity of the drawings, and thus the dimensions of the drawings are not necessarily denote the actual dimensions.

Embodiment 1

A surge protection device of this embodiment is provided with a cavity disposed inside of a ceramic multilayer substrate containing a multilayer body of ceramic substrates (in a portion between the adjacent ceramic substrates), in which the end portions of the discharge electrodes are exposed to the cavity. Referring to FIG. 1, a surge protection device of this embodiment has, specifically, a cavity 2 inside a multilayer body of ceramic substrates 1 (in a portion between the adjacent ceramic substrates 1), a discharge auxiliary electrode 4 on an inner surface of the cavity 2, a pair of discharge electrodes 31 in contact with the discharge auxiliary electrode 4, and outer electrodes 32 formed on the surface of the ceramic substrate 1 and connected to the discharge electrodes 31.

Providing a cavity enables discharge (creeping discharge) to occur along the surface of the discharge auxiliary electrode inside the cavity, which results in an improved response to the occurrence of a surge such as ESD. Without providing a cavity, discharge (internal discharge) along a discharge auxiliary electrode through the inside of a ceramic multilayer substrate may lead to a load being concentrated in the conductive powder, damaging the structure of the conductive powder, and the particles of the conductive powder being bound together, which may cause a short circuit through the discharge auxiliary electrode. Providing a cavity leads to a reduced load being placed on the conductive powder due to gaseous discharge inside the cavity, which results in stabilizing surge protection characteristics (discharge characteristics).

A method for forming a cavity 2 includes, for example, providing a ceramic substrate to which raw material pastes for forming a discharge auxiliary electrode and discharge electrodes are applied, applying a resin paste to a predetermined area on a surface of the ceramic substrate, and then stacking another ceramic substrate. A resin paste is then eliminated by firing to form a cavity between the adjacent ceramic substrates. A material capable of being eliminated by firing, such as carbon, can be used instead of a resin paste. A resin film or the like may be adhered, instead of applying a resin paste or the like by printing and so on, to a predetermined position on a ceramic substrate to form a cavity during firing.

Embodiment 2

A surge protection device of this embodiment includes discharge electrodes and a discharge auxiliary electrode formed on one of main surfaces of a single-layer ceramic substrate. As illustrated in FIG. 3, the surge protection device of this embodiment includes, specifically, a ceramic substrate 1 and a pair of discharge electrodes 31 formed on a surface of the ceramic substrate 1 so as to face each other at the end portions thereof with a space in between, and a discharge auxiliary electrode 4 disposed between the pair of discharge electrodes 31. The surge protection device also includes outer electrodes 32 electrically connected to the respective discharge electrodes 31 at both of the end portions of the ceramic substrate 1.

The surge protection device of this embodiment is arranged, without forming a cavity as in Embodiment 1, to cause a discharge between discharge electrodes at a portion exposed to a surface when a surge occurs. The surge protection device can also provide the above-described effect of the present disclosure, with the discharge auxiliary electrode including the crystalized glass and the conductive powder particles dispersed apart from each other in the crystalized glass.

EXAMPLES

Example 1

(1) Providing Ceramic Substrate and Electrode Material

A ceramic material including Fe, Zn, and Cu as main components was used as a raw material of a ceramic substrate. The materials were blended and mixed to have a predetermined composition (Fe:Zn:Cu=7:2:1), and then calcined at 800 to 1000° C. The resultant calcined powder was pulverized using a zirconia ball mill for 12 hours to obtain a ceramic powder. Organic solvents such as toluene and ekinen were added to the ceramic powder and then mixed. A binder and a plasticizer were further added and then mixed to obtain a slurry. The thus obtained slurry was formed into a ceramic green sheet having a thickness of 50 μm by a doctor blade method.

An electrode paste for forming discharge electrodes was prepared. A solvent was added to 80% by weight of Ag powder having an average particle diameter of about 2 μm and a binder resin including ethyl cellulose and so on, and the resultant mixture was agitated and mixed using a three-roll mill to obtain an electrode paste. The term "average particle diameter", as used herein, refers to a median particle diameter (D50) determined by particle size distribution measurement using a Microtrac.

A mixed paste for forming a discharge auxiliary electrode was prepared. An $Al_2O_3$-coated Ag powder (a coated Ag powder) having an average particle diameter of about 2 μm, and a glass powder having an average particle diameter of about 1 μm and containing Si, Li, Ba, Sr, Ca, Ti, and Al as main components (the softening point measured by differential thermal analysis is 560° C. and the crystallization start temperature measured by differential thermal analysis is 590° C.) were blended in a predetermined ratio. A binder resin and a solvent were added to the obtained mixture, and the resultant mixture was agitated and mixed using a three-roll mill to obtain a mixed paste for forming a discharge auxiliary electrode. The total content of the binder resin and the solvent was 20% by weight, and the total content of the coated Ag powder and the glass powder was 80% by weight in the mixed paste.

A sintering start temperature of the coated Ag powder measured by thermomechanical analysis was 730° C.

A resin paste for forming a cavity is prepared by a similar method. A resin paste consists of only a resin and a solvent. A resin decomposed and eliminated during firing is used as a resin material. The resin material includes, for example, PET, polypropylene, and an acrylic resin.

(2) Applying Discharge Electrodes, Discharge Auxiliary Electrode, and Resin Paste by Screen Printing First, a raw material paste for a discharge auxiliary electrode was applied with a predetermined length to the center of one main surface of a ceramic green sheet. On the resultant sheet, a raw material paste for the discharge electrodes was applied to form a pair of discharge electrodes facing each other with a space as a discharge gap in between, and an end portion of each discharge electrode was in partial contact with a discharge auxiliary electrode disposed below. An application area was adjusted so that the width of the discharge electrodes was 100 μm, the width of the discharge gap (the distance between the facing end portions of the discharge electrodes) was 30 μm. Further, on the resultant sheet, a resin paste was applied to a predetermined area, which leads to the formation of a cavity having a size substantially the same as the size of the discharge auxiliary electrode.

(3) Stacking and Pressure Bonding

A ceramic green sheet (a ceramic substrate) was stacked and pressure bonded in the same way as a general ceramic multilayer substrate. The thickness of the multilayer body was 0.3 mm. The sheet was stacked so that the facing portion of the discharge electrodes and the cavity portion were disposed at the center of the multilayer body.

(4) Cutting

The resultant multilayer body was cut using a micro cutter to provide separate chips in the same way as a chip type electronic component such as an LC filter. The resultant chips had 1.0 mm×0.5 mm.

(5) Firing

Firing was conducted in an air atmosphere in the same way as a general ceramic multilayer substrate.

(6) Applying Outer Electrode and Sintering

After firing, an electrode paste was applied to end surfaces followed by sintering to form outer electrodes.

(7) Plating

The outer electrodes were plated with Ni/Sn by electrolytic plating in the same way as a chip type electronic component such as an LC filter.

A surge protection device including a discharge auxiliary electrode having a configuration as illustrated in FIG. 2, step(d), was manufactured as described above.

Comparative Example 1

As Comparative Example 1, a surge protection device was manufactured by the same method as in Example 1, except that "low-softening-point crystalized glass powder having an average particle diameter of about 1 μm and containing Si, Li, Ba, Sr, Ca, Ti, and Al as main components" of "(1) Providing Ceramic Substrate and Electrode Material" in Example 1 was changed to "high-softening-point glass powder having an average particle diameter of about 1 μm and containing Si, Al, and B as main components". The softening point of the high-softening-point glass powder having an average particle diameter of about 1 μm and including mainly Si, Al, and B is 820° C. (measured by differential thermal analysis).

Test Example 1

Tests on a capability to protect against ESD which is a type of surge were conducted for the surge protection devices obtained in Example 1 and Comparative Example 1. Specifically, ESD were applied 100 times to each of 30 surge protection devices of Example 1 and 30 surge protection devices of Comparative Example 1, and the peak voltage was measured. The ESD application specifically means the electro-static discharge immunity test (level 4), and the test was performed according to the IEC 61000-4-2 standard. The total number of the ESD applications to the devices of Example 1 was 3000 times, and the same number of the ESD applications were conducted for Comparative Example 1. The average (Ave) and standard deviation (σ) of the respective 3000 measured peak voltages were determined. The results are shown in Table 1.

TABLE 1

| | N number | Number of ESD applications | Total number of applications | Peak voltage (Ave) | σ |
|---|---|---|---|---|---|
| Example 1 | 30 | 100 times | 3000 times | 402 V | 23 V |
| Comparative Example 1 | 30 | 100 times | 3000 times | 408 V | 75 V |

As shown in Table 1, σ of the surge protection device of Example 1 is significantly smaller than that of Comparative Example 1. It is thus apparent that a surge protection device of the present disclosure reduces the deviations of the peak voltages during the repeated ESD applications, and that the ESD (surge) protection characteristics of the device are stable and reliable.

1 ceramic substrate
2 cavity
31 discharge electrode
32 outer electrode
4 discharge auxiliary electrode
40 conductive powder
41 sintered conductive powder
50 glass frit
51 glass
52 crystal

The invention claimed is:

1. A surge protection device comprising:
one or more ceramic substrates;
at least one pair of discharge electrodes disposed on one or more surfaces of the ceramic substrates so as to face each other at end portions of the pair of discharge electrodes with a space in between;
outer electrodes electrically connected to the respective discharge electrodes; and
a discharge auxiliary electrode disposed between the end portions of the pair of discharge electrodes,
wherein the discharge auxiliary electrode comprises crystalized glass and conductive powder particles dispersed apart from each other in the crystalized glass.

2. The protection device according to claim 1,
wherein the discharge auxiliary electrode includes 0.1 to 90% by volume of the crystalized glass.

3. The surge protection device according to claim 1,
wherein the crystalized glass includes at least one element selected from the group consisting of Li, Ba, Sr, Ca, and Ti.

4. The surge protection device according to claim 1,
wherein the ceramic substrates are laminated, a cavity is formed in a portion between each adjacent ones of the ceramic substrates, and the end portions of the discharge electrodes are exposed to the cavity.

5. A method for manufacturing the surge protection device according to claim 1, the method comprising the step of forming the discharge auxiliary electrode by firing a mixture containing conductive powder and a glass raw material at a temperature lower than the sintering start temperature of the conductive powder, the glass raw material having a component softened and crystallized to become the crystalized glass at a temperature lower than the sintering start temperature of the conductive powder.

6. The method for manufacturing the surge protection device according to claim 5,
wherein the mixture is fired at a temperature lower than the sintering start temperature of the conductive powder and subsequently the mixture is further fired at a temperature equal to or higher than the sintering start temperature of the conductive powder.

7. The method for manufacturing the surge protection device according to claim 5,
wherein a content of the glass raw material ranges from 0.1 to 90% by volume based on a total volume of the conductive powder and the glass raw material.

8. The method for manufacturing the surge protection device according to claim 5,
wherein the glass raw material includes at least one element selected from the group consisting of Li, Ba, Sr, Ca, and Ti.

9. An electronic component comprising the surge protection device according to claim 1.

* * * * *

UNITED STATES PATENT AND TRADEMARK OFFICE
CERTIFICATE OF CORRECTION

PATENT NO.       : 9,814,124 B2
APPLICATION NO.  : 14/972580
DATED            : November 7, 2017
INVENTOR(S)      : Masanori Okamoto et al.

It is certified that error appears in the above-identified patent and that said Letters Patent is hereby corrected as shown below:

In the Specification

Column 9, Line 37, replace "Table 1, a" with -- Table 1, σ --.

Signed and Sealed this
Fifth Day of June, 2018

Andrei Iancu
*Director of the United States Patent and Trademark Office*